(12) United States Patent
Eriksson et al.

(10) Patent No.: US 8,756,055 B2
(45) Date of Patent: Jun. 17, 2014

(54) SYSTEMS AND METHODS FOR IMPROVING THE INTELLIGIBILITY OF SPEECH IN A NOISY ENVIRONMENT

(75) Inventors: Anders Eriksson, Uppsala (SE); Per Åhgren, Knivsta (SE)

(73) Assignee: Telefonaktiebolaget L M Ericsson (Publ), Stockholm (SE)

( * ) Notice: Subject to any disclaimer, the term of this patent is extended or adjusted under 35 U.S.C. 154(b) by 541 days.

(21) Appl. No.: 13/140,662

(22) PCT Filed: Dec. 19, 2008

(86) PCT No.: PCT/SE2008/051518
§ 371 (c)(1),
(2), (4) Date: Jun. 17, 2011

(87) PCT Pub. No.: WO2010/071521
PCT Pub. Date: Jun. 24, 2010

(65) Prior Publication Data
US 2011/0249827 A1    Oct. 13, 2011

(51) Int. Cl.
*G10L 21/0208* (2013.01)

(52) U.S. Cl.
USPC ........ 704/226; 381/94.1; 381/94.2; 381/94.3; 381/94.7

(58) Field of Classification Search
USPC .............. 704/226; 381/94.1, 94.2, 94.3, 94.7
See application file for complete search history.

(56) References Cited

U.S. PATENT DOCUMENTS

| | | |
|---|---|---|
| 5,479,560 A | 12/1995 | Mekata |
| 2002/0173950 A1 | 11/2002 | Vierthaler |
| 2009/0323982 A1 * | 12/2009 | Solbach et al. ............. 381/94.3 |

OTHER PUBLICATIONS

Sauert, B. et al. "Near End Listening Enhancement with Strict Loudspeaker Output Power Constraining." Proceedings of International Workshop on Acoustic Echo and Noise Control (IWAENC), Paris, France, Sep. 12, 2006.
Sauert, B. et al. "Near End Listening Enhancement: Speech Ingelligibility Improvement in Noisy Environments." IEEE International Conference on Acoustics, Speech and Signal Processing, Toulouse, France, May 14-19, 2006.
Westerlund, N. et al. "Speech Enhancement using an Adaptive Gain Equalizer with Frequency Dependent Parameter Settings." IEEE 60th Vehicular Technology Conference, Los Angeles, CA, USA, Sep. 26-29, 2004.

* cited by examiner

*Primary Examiner* — Duc Nguyen
*Assistant Examiner* — George Monikang
(74) *Attorney, Agent, or Firm* — Coats & Bennett, P.L.L.C.

(57) ABSTRACT

One aspect of the invention provides a method for enhancing speech output by an electro-acoustical transducer in a noisy listening environment. In some embodiments, this method includes: filtering an input audio signal x(t) using a filter H(z) to produce a filtered audio signal x(t) formula (I), wherein x(t) formula (I)—H(z)x(t); providing to an electro-acoustical transducer a signal corresponding to the filtered audio signal x(t) formula (I) to produce a sound wave corresponding to the filtered audio signal; and prior to filtering the audio signal using the filter, configuring the filter such that, with respect to one or more frequencies, the filtered audio signal has a higher signal level than the input audio signal, and such that the overall signal level of the filtered audio signal ($sl_f$) is substantially related to the overall signal level of the input signal ($sl_r$) such that $si/=sl_i \times c$.

31 Claims, 4 Drawing Sheets

SYSTEMS AND METHODS FOR IMPROVING THE INTELLIGIBILITY OF SPEECH IN A NOISY ENVIRONMENT

TECHNICAL FIELD

The present invention relates to systems and methods for improving the intelligibility of speech in the presence of ambient noise.

BACKGROUND

When talking in a noisy environment, a talker adjusts the level and the spectral content of his/her speech based on the level of ambient noise to make his/her speech more intelligible. This is called the Lombard effect (see e.g., J. C. Junqua, "The Lombard reflex and its role on human listeners and automatic speech recognizer," J. Acoustic Soc. Amer., Vol. 93, 1993, 510-524.). When mobile terminals are used in noisy environments, it is desired that the terminal behave in a similar manner (i.e., the speech in the received down-link signal should be processed in such a way that the resulting speech emitted from the electro-acoustical transducer (e.g., loudspeaker) of the terminal is as intelligible as possible when reaching the ear of the user of the terminal.

In several studies, speech intelligibility has been improved by increasing the power of the speech signal (see e.g., "The influence of first and second formants on the intelligibility of clipped speech," J. Audio Eng. Soc., vol. 16, pp. 182-185, 1968; R. J. Niederjohn and J. H. Grotelueschen, "The enhancement of speech intelligibility in high noise levels by high-pass filtering followed by rapid amplitude compression," IEEE Trans. Acoust., Speech, Signal Processing, vol. ASSP-24, pp. 277-282, August 1976; and J. Lynch, "A methodology for evaluating the performance of dynamic range control algorithms for speech enhancement", Acoustics, Speech, and Signal Processing, IEEE International Conference on ICASSP '87. Volume 12, April 1987 Page(s):153-156). Examples of applications that do this are adaptive level controllers and compressors (see e.g., J. Lynch, "A methodology for evaluating the performance of dynamic range control algorithms for speech enhancement", Acoustics, Speech, and Signal Processing, IEEE International Conference on ICASSP '87. Volume 12, April 1987 Page(s):153-156).

For a signal that already is close to its digital overload level it is, however, not possible to increase intelligibility by increasing the power level of the speech, since this would cause digital clipping and hence a distortion of the signal. Accordingly, a method that preserves the level of the speech while optimizing the spectral characteristics is of interest.

Studies have shown that emphasizing the second formant of the speech relative to the first formant may improve the intelligibility of the speech while maintaining the overall signal power (see e.g., J. C. Junqua, "The Lombard reflex and its role on human listeners and automatic speech recognizer," J. Acoustic Soc. Amer., Vol. 93, 1993, 510-524; I. B. Thomas, "The second formant and speech intelligibility," in Proc. Nut. Electronics Conf., vol. 23, 1967, pp. 544-548; and "The influence of first and second formants on the intelligibility of clipped speech," J. Audio Eng. Soc., vol. 16, pp. 182-185, 1968).

Methods based on linear filtering for improving intelligibility are discussed in B Sauert, G Enzner, and P. Vary, "Near end listening enhancement with strict loudspeaker output power constraining", International Workshop on Acoustic Echo and Noise Control, IWAENC 2006, September 12-14, Paris, France. A method of producing an equal SNR at all frequencies is presented and also a method doing the opposite (i.e., attenuating the signal at inaudible frequencies and amplifying the audible frequencies).

It should be noted that the methods of altering the spectral characteristics of the signal may be used in conjunction with a method that raises the overall level. Prior altering the spectral characteristics, a frequency independent gain may be applied to raise the overall signal level, if the overload point not is reached.

A problem with methods that alter the spectral characteristics of the emitted speech is the inability to obtain the maximum desired effect in a controlled manner. What is desired, therefore, are improved systems and methods for improving intelligibility of speech in a noisy environment.

SUMMARY

In one aspect, the invention provides a method for enhancing speech output by a electro-acoustical transducer (e.g., a loudspeaker) in a noisy listening environment. In some embodiments, this method includes the following steps: filtering (in either the frequency or time domain) an input audio signal x(t) using a filter H(z) (e.g., FIR filter in some embodiments) to produce a filtered audio signal $\bar{x}(t)$, wherein $\bar{x}(t)=H(z)x(t)$; providing to an electro-acoustical transducer a signal corresponding to the filtered audio signal $\bar{x}(t)$ to produce a sound wave corresponding to the filtered audio signal; and prior to filtering the audio signal using the filter, configuring the filter such that, with respect to one or more frequencies, the filtered audio signal has a higher signal level than the input audio signal, and such that the overall signal level of the filtered audio signal ($sl_f$) is substantially related to the overall signal level of the input signal ($sl_r$) such that $sl_f=sl_r \times c$, where c is a constant (in some embodiments c is equal to or about equal to 1). In some embodiments, the filter is configured such that the overall signal level of the filtered audio signal is substantially equal to the overall signal level of the input audio signal. In embodiments where the filter is a FIR filter, the FIR filter is obtained from a determined gain for each of a plurality of discrete frequencies.

In some embodiments, the filter is configured such that a signal-to-noise ratio (SNR) of a sound wave produced as a result of providing to the electro-acoustical transducer the signal corresponding to the filtered audio signal to background noise is maximized while restricting the maximum and minimum alteration of the filtered audio signal at different frequencies. The maximization of the SNR may be weighted differently for the different frequencies.

In some embodiments, the step of configuring the filter comprises: estimating, based on at least a portion of the input audio signal, a signal spectrum $P_x(f)$; estimating, based on at least a portion of an audio signal corresponding to a signal received by an acoustic-electronic transducer (e.g., microphone), a noise spectrum $P_y(f)$; and for each of a plurality of frequencies $f$, determining a gain $\gamma(f)$ for the filter based, at least in part, on the estimated spectra $P_x(f)$ and $P_y(f)$. The step of determining $\gamma(f)$ may include: determining, for each said frequency $f$, $\Phi_s(f)/\Phi_n(f)$, where $\Phi_s(f)$ is a function of $P_x(f)$ and $\Phi_n(f)$ is a function of $P_y(f)$; and maximizing ($\Sigma\gamma(f) \cdot$SNR $(f) \cdot W(f)$), subject to the constraint that (i) $\Sigma\gamma(f) \cdot P_x(f)$ is equal or substantially equal to $c\Sigma P_x(f)$, where c is a constant or time varying and (ii) $\gamma(f)$ is greater than or equal to a first value (e.g., a minimum threshold $\gamma_{min}(f)$) and/or less than or equal to a second value (e.g., a maximum threshold $\gamma_{max}(f)$), wherein SNR$(f)=\Phi_s(f)/\Phi_n(f)$ and W$(f)$ is a predetermined weight for frequency $f$. In some embodiments, $\gamma_{min}(f)$=min (1,max(c1, SNR$(f)$/c2)), wherein c1 and c2 are predetermined values. In some embodiments, the step of determining $\gamma(f)$ comprises determining $\gamma_{ER}(f)$, wherein, for $f<f_t$, $\gamma_{ER}(f)=\min(1,\max(c1, SNR(f)/c2))$, wherein $f_t$, c1 and c2 are predetermined values and $SNR(f)=\Phi_s(f)/\Phi_n(n)$. In some embodiments, $\Phi_s(f)=\Lambda_{rx}(f)\cdot P_s(f)$, where $P_s(f)$ is a function of $P_x(f)$ and $\Lambda_{rx}(f)$ is a function of the electro-acoustical transducer; and $\Phi_n(f)=\Lambda_{rx}(f)\cdot P_x(f)$, where $P_n(f)$ is a function of $P_y(f)$ and $\Lambda_{tx}(f)$ is a function of the an acoustic-electronic transducer.

In another aspect, the present invention provides a device for outputting a audio signal. In some embodiments, the device includes: an electro-acoustical transducer for converting an electronic signal into acoustic energy audible at a listening point; an acoustic-electronic transducer for converting acoustic energy at or adjacent to the listening point into a noise signal; an adaptable filter for filtering an input audio signal to produce a filtered audio signal; a digital to analog converter for converting the filtered audio signal to an analog audio signal, wherein an output of the digital to analog converter is coupled to the electro-acoustical transducer so that the electro-acoustical transducer receives the analog signal; and a controller module adapted to configure the adaptable filter such that, with respect to one or more frequencies, the filtered audio signal has a higher signal level than the input audio signal, and such that the overall signal level of the filtered audio signal ($sl_f$) is substantially related to the overall signal level of the input audio signal ($sl_r$) such that $sl_f=sl_r\times c$, where c is a constant.

The above and other aspects and embodiments are described below with reference to the accompanying drawings.

BRIEF DESCRIPTION OF THE DRAWINGS

The accompanying drawings, which are incorporated herein and form part of the specification, illustrate various embodiments of the present invention and, together with the description, further serve to explain the principles of the invention and to enable a person skilled in the pertinent art to make and use the invention. In the drawings, like reference numbers indicate identical or functionally similar elements.

DETAILED DESCRIPTION

Figure 1:
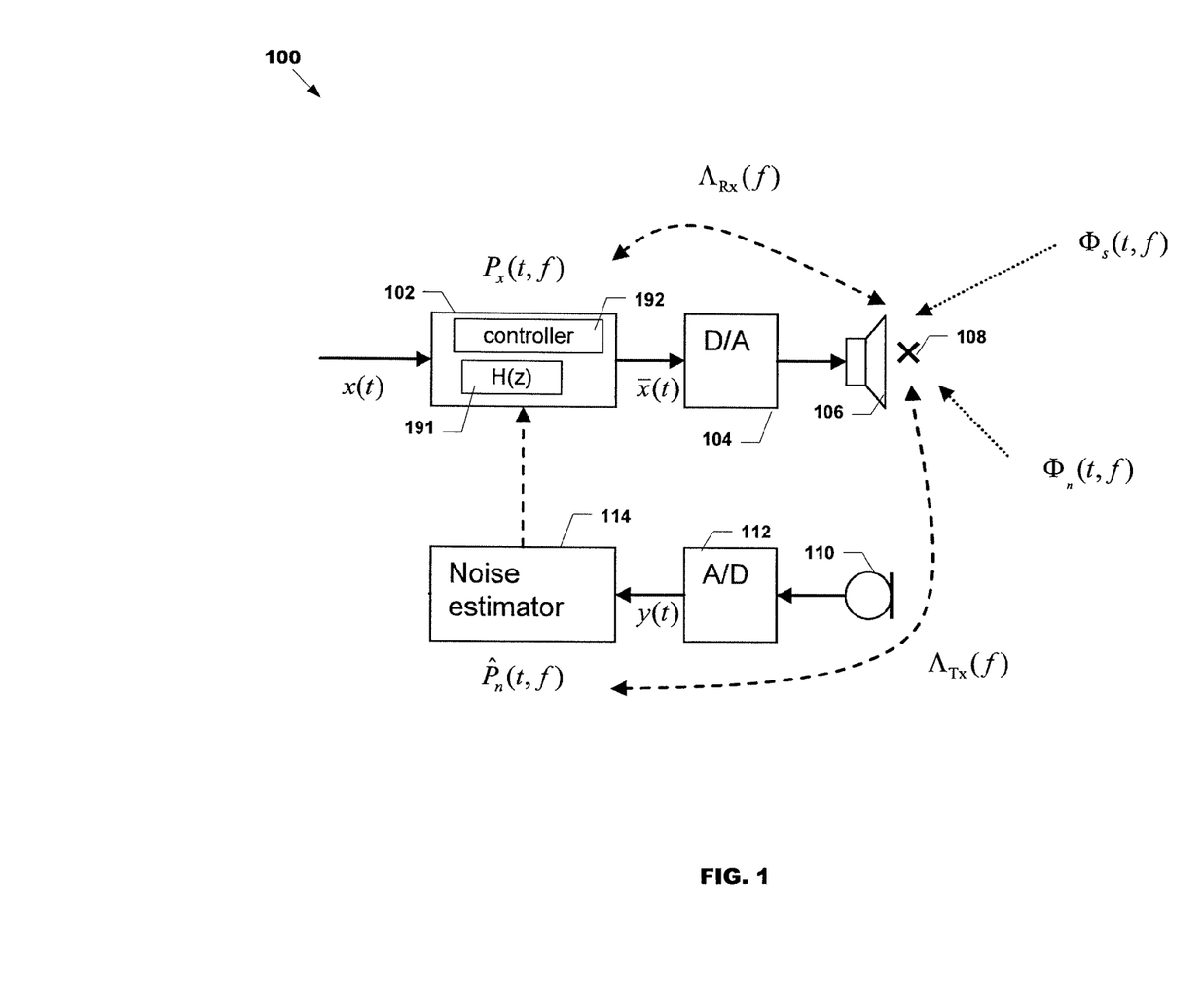
FIG. 1 is a functional block diagram of a device according to some embodiments of the invention.

Referring now to FIG. 1, FIG. 1 illustrates a device 100, according to some embodiments of the invention, that is capable of producing speech and that is capable to improve the intelligibility of the speech in a noisy environment.

Device 100 either produces or receives an input audio signal x(t) and filters audio signal x(t) using a filter system 102 to produce a filtered audio signal $\bar{x}(t)$, where $\bar{x}(t)=H(z)x(t)$ and H(z) is an adaptable filter 191 used by the filter system. The filtered audio signal $\bar{x}(t)$ is provided to an electro-acoustical transducer (e.g., a loudspeaker) 106 to produce a sound wave corresponding to the filtered audio signal (i.e., emitted speech). More specifically, in some embodiments, the filtered audio signal $\bar{x}(t)$ is provided to a digital to analog converter 104 that receives the filtered audio signal $\bar{x}(t)$ and produces an analog signal corresponding to the filtered audio signal $\bar{x}(t)$, and this analog signal is provided to electro-acoustical transducer 106, which produces a sound wave based on the analog signal.

The filter H(z) 191 is configured to optimize the signal-to-noise ratio of emitted speech to the ambient environmental noise. Additionally, the filter may be configured to not increase the overall signal level of the emitted speech. The filtering operation $\bar{x}(t)=H(z)x(t)$ may be implemented in the frequency domain or in the time domain using a finite impulse response filter (FIR) H(z) that is obtained from a desired gain function $\gamma(f)$ at the discrete frequencies, using, for example, the technique described in U.S. Pat. No. 7,251,271.

Accordingly, prior to the input audio signal x(t) being filtered by filter system 102, a controller module 192 of filter system 102 configures adaptable filter 191 (i.e., H(z)) such that, with respect to one or more frequencies, the filtered audio signal $\bar{x}(t)$ will have a higher signal level than the input audio signal x(t). Additionally, filter H(z) may be configured such that the overall signal level ($sl_f$) of the filtered audio signal $\bar{x}(t)$ will be substantially related to the overall signal level ($sl_r$) of the input signal x(t) such that $sl_f=sl_r\times c$, where c is a constant. In some embodiments, c is equal to or about 1.

Controller module 192 is configured to configure adaptable filter 191 based on the audible noise ($\Phi_n$) at the ear reference point (ERP) 108 and input signal x(t).

The audible noise $\Phi_n$ is converted into an electrical signal y(t) by an acoustic-electronic transducer 110 (e.g., a microphone). Signal y(t) is received by a noise estimator module 114, which is configured to produce an estimated spectra $P_y(f)$ of signal y(t), where f denotes a discrete frequency. For example, noise estimator module 114 may be configured to use a discrete Fourier transform to produce spectra $P_y(f)$ from signal y(t). That is, in some embodiments, $P_y(f)=|Y(f)|^2$, where $Y(f)=DFT(y(t))$. Similarly, controller module 192 is configured to produce an estimated spectra $P_x(f)$ of input signal x(t). That is, in some embodiments, $P_x(f)=|X(f)|^2$, where $X(f)=DFT(x(t))$. Controller module 192 is configured to use spectral $P_y(f)$ and $P_x(f)$ to configure the filter H(z) (e.g., to compute the frequency characteristic of the filter H(z) to obtain the desired objective).

Figure 2:
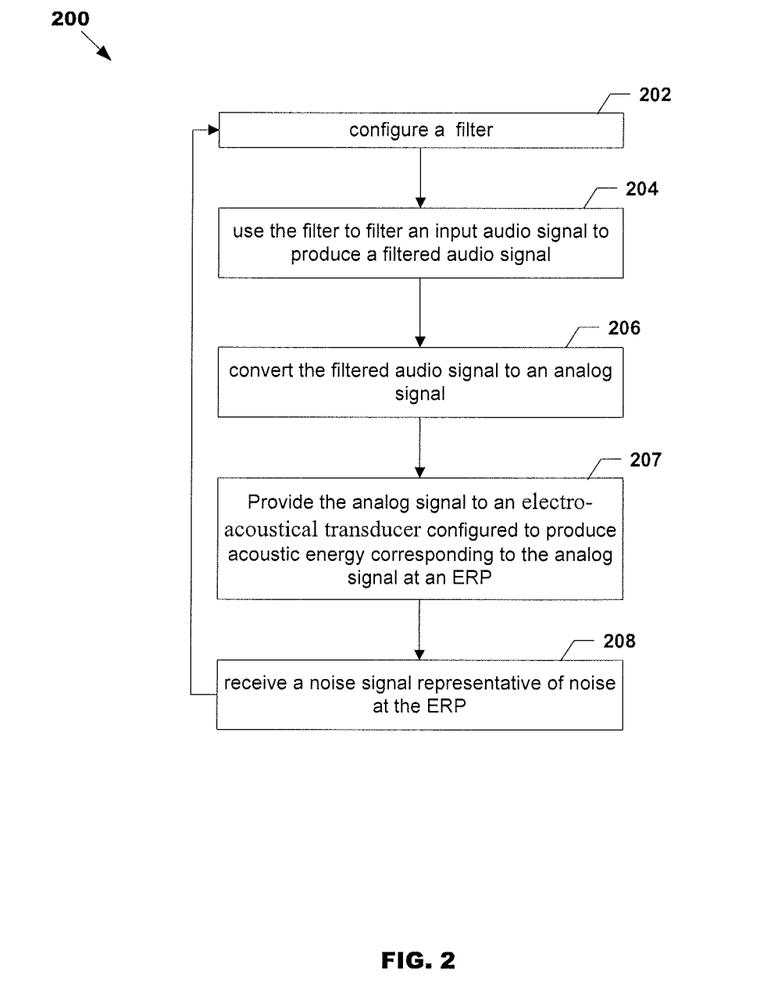
FIG. 2 is a flow chart illustrating a process according to some embodiments of the invention.

The above described process is illustrated in FIG. 2. Referring now to FIG. 2, FIG. 2 is a flow chart illustrating a process 200 according to some embodiments of the invention. Process 200 may begin in step 202, where controller module 192 configures filter H(z) to optimize the signal-to-noise ratio of emitted speech to the ambient environmental noise. Next (step 204), filter H(z) is used to filter the input audio signal x(t) to produce the filtered audio signal $\bar{x}(t)$. Next (step 206), the filtered audio signal $\bar{x}(t)$ is converted to an analog signal using digital to analog converter 104. Next (step 207), the analog signal is provided to electro-acoustical transducer 106, which produces a sound wave corresponding to the filtered audio signal $\bar{x}(t)$. Because the produced sound wave corresponds to the filtered audio signal $\bar{x}(t)$ rather than the input audio signal x(t), the sound wave is more intelligible than it would have been had it corresponded to the input audio signal x(t). Next (step 208) a noise signal representative of nose at ERP 108 is received. After step 208, the process goes back to step 202, where controller module 192 again configures the filter H(z) based on the received noise signal and the input audio signal x(t). In this manner, the invention provides a method for increasing the audibility of the signal produced by electro-acoustical transducer 106 by configured a filter based on the background noise signal and input audio signal.

As discussed above, controller module 192 is configured to use spectras $P_y(f)$ and $P_x(f)$ to configure the filter H(z). More specifically, in some embodiments, controller module 192 uses computed spectras $P_y(f)$ and $P_x(f)$ to derive the spectra of the down link speech and the near-end nose at ERP 108, $\Phi_s(f)$ and $\Phi_n(f)$, respectively. For example, in some embodiments, $\Phi_s(f)=\Lambda_{RX}(f)\cdot P_s(f)$ and $(\Phi_n(f)=\Lambda_{TX}(f)\cdot P_n(f)$, where $\Lambda_{RX}(f)$ is the transfer function of electro-acoustical transducer 106, $\Lambda_{TX}(f)$ is the transfer function of acoustic-electronic transducer 110, $P_s(f)$ is a function of $P_x(f)$, and $P_n(f)$ is a function of $P_y(f)$. Thus, in some embodiments, controller module 192 uses $\Phi_s(f)$ and $\Phi_n(f)$ to configure filter $H(z)$.

The transfer functions of the electro-acoustical interfaces, $\Lambda_{RX}(f)$ and $\Lambda_{TX}(f)$ may be pre-computed through a calibration procedure relating digital signal levels to acoustical sound pressure. Typically, this may be performed by simultaneously measuring the acoustical sound pressure and the digital level of the signals.

Due to the non-stationary characteristics of the speech signal, the desired filter characteristics $H(z)$ is time dependent, and based on spectrum estimates at any given time. For convenience, this time dependence is omitted in the notation. Typically, the processing is based on frames of samples corresponding to 20 ms, resulting in 160 samples for 8 kHz sample rate and 320 samples for 16 kHz sample rate.

In some embodiments, the spectra $P_x(f)$ and $P_y(f)$ are estimated using, for example, the periodogram estimate based on the Fast Fourier Transform (FFT) of frames of speech samples, $x(t)$, and $y(t)$, respectively (see e.g., P. Stoica and R. Moses, "Introduction to spectral analysis", Prentice Hall). With a frame length of 20 ms, suitable lengths for the FFT are 256 and 512, respectively, where the original frames either are zero padded or extended with samples from previous frames. In some embodiments, the estimated speech and noise spectra, $P_s(f)$ and $P_n(f)$, respectively, is based on averaging the frame based spectrum estimates as follows:

$$P_s(k,f) = (1-\lambda_s)P_s(k-1,f) + \lambda_s P_x(k,f)$$

and $$P_n(k,f) = (1-\lambda_n)P_n(k-1,f) + \lambda_n P_y(k,f),$$

where the index k denotes the estimate for a particular frame. The averaging constants $\lambda_s$ and $\lambda_n$ may be time varying and controlled via voice activity detection to update the speech spectrum $P_s(f)$ when speech is present in $x(t)$, and update $P_n(f)$ when $y(t)$ only contains noise. An example of a voice activity detection algorithm can be found in, for example, 3GPP TS 26.094, Adaptive Multi-Rate (AMR) speech codec; Voice Activity Detector.

As mentioned above, controller module 192 uses $\Phi_s(f)$ and $\Phi_n(f)$ to configure filter $H(z)$. For example, in some embodiments, controller module 192 calculates a desired gain function $\gamma(f)$ for the filter $H(z)$ using $\Phi_s$ and $\Phi_n(f)$. More specifically, in some embodiments, controller module 192 determines $\gamma(f)$ by maximizing:

$$\left( \sum_{f_0} \gamma(f) \cdot SNR(f) \cdot W(f) \right) \equiv \max(\varphi^T \bar{\gamma})$$

subject to the following constraints (1) and (2):

$$\sum_{f_c} \gamma(f) \cdot P_x(f) = c \sum_{f_c} P_x(f) \Leftrightarrow \psi^T \bar{\gamma} = K; \text{ and} \quad (1)$$

$$\gamma_{min}(f) \leq \gamma(f) \leq \gamma_{max}(f) \forall f \Leftrightarrow \begin{array}{l} -\bar{\gamma} \leq -\bar{\gamma}_{min} \\ \bar{\gamma} \leq \bar{\gamma}_{max} \end{array}, \text{ where} \quad (2)$$

$$SNR(f) = \frac{\Phi_s(f)}{\Phi_n(f)}, \gamma(f) = |H(e^{j2\pi f})|^2,$$

and c is a constant or time varying.

The parameters $W(f)$ and $\gamma_{min}$ and $\gamma_{max}$ are possibly dependent on the characteristics of the signals $x(t)$ and $y(t)$. For example, $\gamma_{min}$ and $\gamma_{max}$ may be a function of $SNR(f)$.

Alternatively to having a limit on the maximum and minimum of the desired gain, the maximum difference in the gain function may be specified. This may be formulated as the constraint:

$$\alpha \leq \gamma(f) \leq \beta, \beta \leq \gamma_{diff} \alpha \Leftrightarrow \begin{array}{l} -\bar{\gamma} \leq -\alpha \\ \bar{\gamma} \leq \beta \\ \beta \leq \gamma_{diff} \cdot \alpha \end{array}$$

The optimization problem described above can be viewed as a linear programming problem, and the solution to the optimization problem may be obtained using the simplex algorithm (see e.g., M. S. Bazaraa, H. D. Sherali, C. M. Shetty, "Nonlinear programming", John Wiley & Sons). The linear programming problem equals minimizing $(-\phi^T \bar{\gamma})$ subject to the constraints $$\psi^T \cdot \bar{\gamma} = K$$

$$\begin{bmatrix} -I \\ I \end{bmatrix} \cdot \bar{\gamma} \leq \begin{bmatrix} -\gamma_{min} \\ \gamma_{max} \end{bmatrix}.$$

Alternatively, with the limit on the difference between the minimum and maximum of the gain, as minimizing $$\left( [-\varphi^T \; 0 \; 0] \cdot \begin{bmatrix} \bar{\gamma} \\ \alpha \\ \beta \end{bmatrix} \right),$$

subject to the constraints $$[\psi^T \; 0 \; 0] \cdot \begin{bmatrix} \bar{\gamma} \\ \alpha \\ \beta \end{bmatrix} = K$$

$$\begin{bmatrix} -I & \bar{1} & \bar{0} \\ I & \bar{0} & -\bar{1} \\ \bar{0}^T & -\gamma_{diff} & 1 \end{bmatrix} \cdot \begin{bmatrix} \bar{\gamma} \\ \alpha \\ \beta \end{bmatrix} \leq \begin{bmatrix} \bar{0} \\ \bar{0} \\ 0 \end{bmatrix}$$

In some embodiments, filter $H(z)$ should affect the emitted speech only in conditions when the intelligibility of the unprocessed electro-acoustical transducer signal would be reduced. Thus, at any frequency or frequency range were the original speech already is audible, the filter should not reduce the signal level. This can be achieved by making the threshold $\gamma_{min}(f)$ dependent on the SNR at the given frequency. Choosing $\gamma_{min}(f) = \min(1.0, \max(\gamma \text{lower}_{\_limit}, SNR(f)/SNR_{threshold}))$ will result in a gradual introduction of the effect at frequencies with SNR less than $SNR_{threshold}$.

Additionally, in order to reduce the fluctuations of the frequency characteristics of $H(z)$ between different time instances, the frequency resolution of $H(z)$, $\gamma(f)$, may be reduced by combining adjacent bins from the FFT used for computing the discrete time Fourier transform. Further, since the fluctuations of the speech spectrum over time is large for higher frequencies, only one gain may be determined for frequencies above a certain threshold frequency ($f_r$). This threshold frequency $f_t$ may be in the order of 1-2 kHz and may be varying dependent on the signal characteristics.

As discussed above, the solution to the optimization problem described above may be obtained using the simplex algorithm. However, the simplex algorithm may be too computationally demanding for certain applications. To reduce the computational complexity, an approximation may be implemented. For example, for frequencies below $f_r$, a gain function is computed using, for example, $\gamma_{ER}(f)$ min(1.0, max ($\gamma_{lower\_limit}$, SNR($f$)/SNR$_{threshold}$)). Next, the power that has been removed for $f<f_r$ is redistributed to the frequencies $f \geq f_T$ by computing the $\gamma_{ER}(f_T)$ that gives the power increase for $f \geq f_T$ equal to the power decrease given by $\gamma_{ER}(f)$ for $f<f_T$, $$\gamma_{ER}(f_T) = \frac{\left(\sum_{f \geq f_T} P_s(t, \omega)\right) + \left(\sum_{f<f_T} (1 - \gamma_{ER}(f)) \cdot P_s(f)\right)}{\sum_{f \geq f_T} P_s(f)}.$$

The above computation ensures that the average speech power is not altered by $\gamma_{ER}(f)$ and thereby fixates the shape of the power redistribution between $f<f_r$ and $f \geq F_T$. To ensure that the power of the down-link signal remains unaltered $\gamma_{ER}(f)$ can be scaled according to:

$$\gamma(f) = \gamma_{ER}(f) \frac{\sum_f P_x(f)}{\sum_f \gamma_{ER}(f) \cdot P_x(f)}.$$

Figure 3:
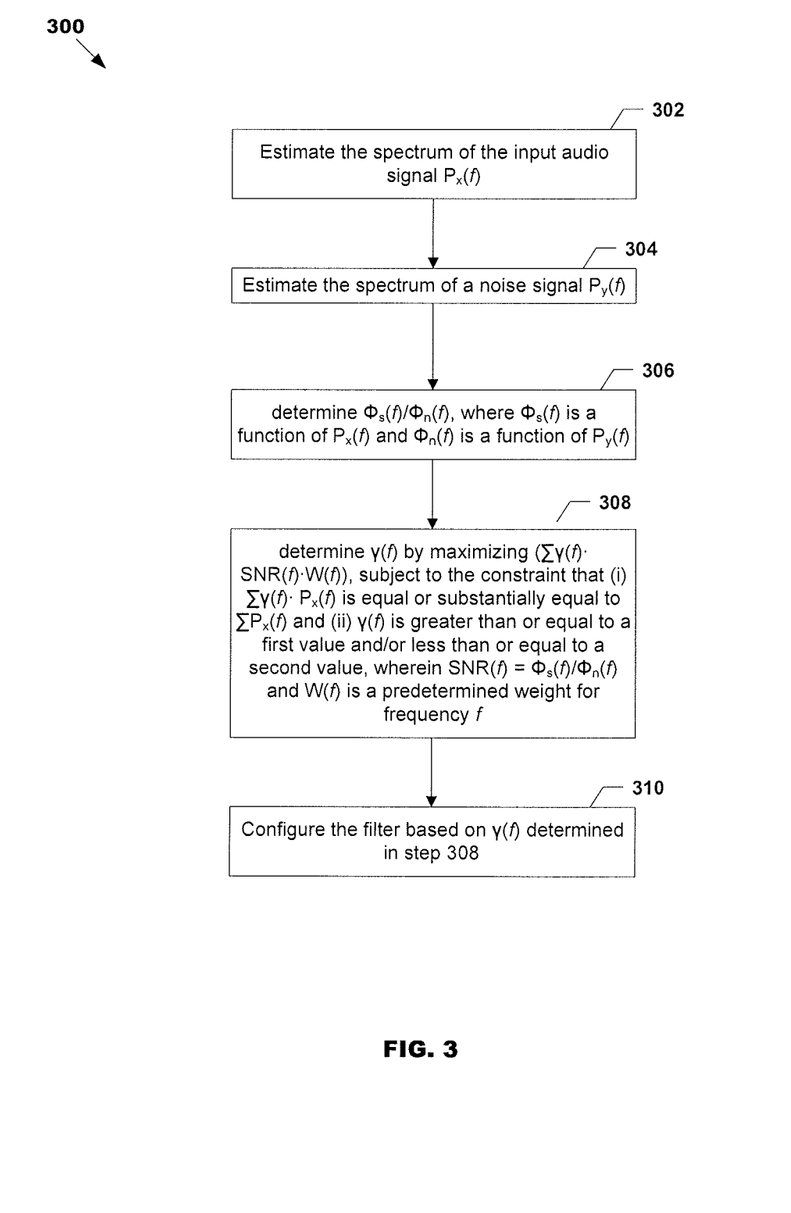
FIG. 3 is a flow chart illustrating a process according to some embodiments of the invention.

Referring now to FIG. 3, FIG. 3 is a flow chart 300 illustrating some of the steps described above for configuring filter H(z). Process 300 may begin in step 302, where controller module 192 estimates the spectrum $P_x(f)$ of the input audio signal x(t). Next (step 304), module 114 estimates the spectrum $P_y(f)$ of audio signal y(t), which corresponds to the signal output by acoustic-electronic transducer 110. Next (step 306), controller module 192 computes $$SNR(f) = \frac{\Phi_s(f)}{\Phi_n(f)}.$$

Next (step 308), controller module 192 determines $\gamma(f)$ by maximizing ($\Sigma\gamma(f) \cdot SNR(f) \cdot W(f)$), subject to the constraint that (i) $\Sigma\gamma(f) \cdot P_x(f)$ is equal or substantially equal to $\Sigma P_x(f)$ and (ii) $\gamma(f)$ is greater than or equal to a first value and/or less than or equal to a second value, wherein W($f$) is a predetermined weight for frequency $f$. Next (step 310), module configures filter H(z) based on $\gamma(f)$ determined in step 308.

Figure 4:
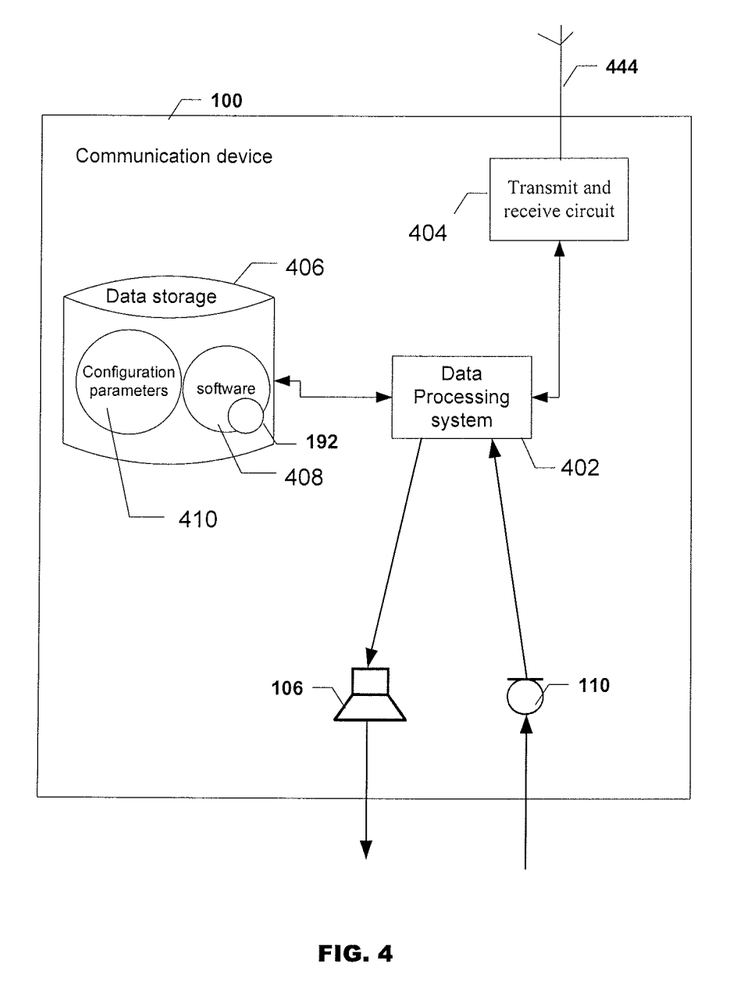
FIG. 4 is a functional block diagram of a mobile terminal according to some embodiments of the invention.

Referring now to FIG. 4, FIG. 4 is a functional block diagram of device 100 according to some embodiments of the invention. As shown, device 100 may comprise a data processing system 402 (e.g., one or more microprocessors and/or digital signal processors), a data storage system 406 (e.g., one or more non-volatile storage devices) and computer software 408 stored on the storage system 406. Configuration parameters 410 may also be stored in storage system 406. In embodiments where device 100 is a mobile communication terminal (e.g., mobile phone), device 100 may include transmit/receive (Tx/Rx) circuitry 404 for transmitting data to and receiving data from a base station. In some embodiments, software 408 is configured such that when processor 402 executes software 408, device performs steps described above with reference to the flow chart shown in FIG. 3. For example, controller module 192 may be implemented in software (i.e., software 408 may include controller module 192).

While various embodiments of the present invention have been described above, it should be understood that they have been presented by way of example only, and not limitation. Thus, the breadth and scope of the present invention should not be limited by any of the above-described exemplary embodiments.

Additionally, while the processes described above and illustrated in the drawings are shown as a sequence of steps, this was done solely for the sake of illustration. Accordingly, it is contemplated that some steps may be added, some steps may be omitted, the order of the steps may be re-arranged, and some steps may be performed in parallel.

What is claimed is:

1. A method for enhancing speech output by an electro-acoustical transducer in a noisy listening environment, comprising:

filtering an input audio signal x(t) using an adaptable filter H(z) to produce a filtered audio signal $\bar{x}$(t);

providing the electro-acoustical transducer an analog signal corresponding to the filtered audio signal to produce a sound wave corresponding to the filtered audio signal; and prior to filtering the audio signal using the filter, configuring the filter such that, with respect to one or more frequencies $f$, the filtered audio signal has a higher signal level than the input audio signal, and such that the overall signal level of the filtered audio signal $sl_{\bar{x}}$ relates to the overall signal level of the input signal $sl_x$ such that $sl_{\bar{x}} = sl_x \times c$, where c comprises a constant, wherein the step of configuring the filter comprises:

estimating, based on at least a portion of the input audio signal, a signal spectrum $P_x(f)$; and estimating, based on at least a portion of an audio signal corresponding to a signal received by an acoustic-electronic transducer, a noise spectrum $P_y(f)$, and for each of the one or more frequencies $f$, determining a gain function $\gamma(f)$ for the filter based on the estimated spectra $P_x(f)$ and $P_y(f)$, wherein determining the gain function comprises:

for each of the one or more frequencies $f$, determining SNR($f$) based on $P_x(f)$ and $P_y(f)$ and determining the gain function based on $\gamma_{ER}(f)$, wherein, for $f<f_T$, $\gamma_{ER}(f)$=min(1,max(c1, SNR($f$)/c2)), wherein $f_T$, c1, and c2 comprise predetermined values.

2. The method of claim 1, wherein the overall signal level of the filtered audio signal generally equals the overall signal level of the input audio signal.

3. The method of claim 1, wherein c=1.

4. The method of claim 1, wherein the filter is configured such that a signal-to-noise ratio of a sound wave produced as a result of providing to the electro-acoustical transducer the signal corresponding to the filtered audio signal to background noise is maximized while restricting the maximum and minimum alteration of the filtered audio signal at different frequencies.

5. The method of claim 4, where said maximization of the signal-to-noise ratio is weighted differently for the different frequencies.

6. The method of claim 1, wherein determining the gain function comprises for each said frequency $f$, determining $\phi_s(f)/\phi_n(f)$, where $\phi_s(f)$ comprises a function of $P_x(f)$ and $\phi_n(f)$ comprises a function of $P_y(f)$ and wherein $SNR(f)=\phi_s(f)/\phi_n(f)$.

7. The method of claim 6, wherein determining the gain function further comprises maximizing $(\Sigma\gamma(f)\cdot SNR(f)\cdot W(f))$, subject to the constraint that (i) $\Sigma\gamma(f)\cdot P_x(f)$ generally equals $\Sigma P_x(f)$ and (ii) the gain function is at least one of greater than or equal to a first value and less than or equal to a second value, wherein $SNR(f)=\phi_s(f)/\phi_n(f)$ and $W(f)$ comprises a predetermined weight for frequency $f$.

8. The method of claim 7, wherein the first value comprises a minimum threshold $\gamma_{min}(f)$ and the second value comprises a maximum threshold $\gamma_{max}(f)$.

9. The method of claim 6, wherein:

$\phi_s(f) = \Lambda_{rx}(f)\cdot P_s(f)$, where $P_s(f)$ comprises a function of $P_x(f)$ and $\Lambda_{rx}(f)$ comprises a function of the electro-acoustical transducer; and $\phi_n(f) = \Lambda_{tx}(f)\cdot P_n(f)$, where $P_n(f)$ comprises a function of $P_y(f)$ and $\Lambda_{tx}(f)$ comprises a function of the acoustic-electronic transducer.

10. The method of claim 1, wherein $\gamma_{ER}(f_T)$ is determined according to:

$$\gamma_{ER}(f_T) = \frac{\left(\sum_{f \geq f_T} P_S(t,\omega)\right) + \left(\sum_{f < f_T}(1-\gamma_{ER}(f))\cdot P_S(f)\right)}{\sum_{f \geq f_T} P_S(f)}.$$

11. The method of claim 10, further comprising determining the gain function according to:

$$\gamma(f) = \gamma_{ER}(f)\frac{\sum_f P_x(f)}{\sum_f \gamma_{ER}(f)\cdot P_x(f)}.$$

12. The method of claim 10, wherein:

$\phi_s(f) = \Lambda_{rx}(f)\cdot P_s(f)$, where $P_s(f)$ comprises a function of $P_x(f)$ and $\Lambda_{rx}(f)$ comprises a function of the electro-acoustical transducer; and $\phi_n(f) = \Lambda_{tx}(f)\cdot P_n(f)$, where $P_n(f)$ comprises a function of $P_y(f)$ and $\Lambda_{tx}(f)$ comprises a function of the acoustic-electronic transducer.

13. The method of claim 1, wherein of filtering the audio signal using the adaptable filter H(z) to produce a filtered audio signal comprises filtering the audio signal in the frequency domain using the adaptable filter H(z).

14. The method of claim 1, further comprising converting the filtered audio signal to the analog audio signal using a digital to analog converter.

15. The method of claim 1, wherein filtering the audio signal using the adaptable filter H(z) to produce a filtered audio signal comprises obtaining a finite impulse response filter from a determined gain for each of a plurality of discrete frequencies and filtering the audio signal using the finite impulse response filter in the time domain.

16. A device for producing acoustic waves, comprising:

an electro-acoustical transducer for converting an electronic signal into acoustic energy audible at a listening point;

an acoustic-electronic transducer for converting acoustic energy at or adjacent to the listening point into a noise signal;

an adaptable filter for filtering an input audio signal to produce a filtered audio signal;

a digital to analog converter for converting the filtered audio signal to an analog audio signal, wherein an output of the digital to analog converter couples to the electro-acoustical transducer so that the electro-acoustical transducer receives the analog signal; and a controller module adapted to configure the adaptable filter such that, with respect to one or more frequencies $f$, the filtered audio signal has a higher signal level than the input audio signal, and such that the overall signal level of the filtered audio signal $sl_f$ relates to the overall signal level of the input audio signal $sl_r$ such that $sl_f = sl_r \times c$, where c comprises a constant, wherein the controller module configures the adaptable filter by:

estimating, based on at least a portion of the input audio signal, a signal spectrum $P_x(f)$;

estimating a noise spectrum $P_y(f)$ based on at least a portion of the noise signal output by the acoustic-electronic transducer; and configuring the adaptable filter by: determining a gain function $\gamma(f)$ for the adaptable filter based on the estimated spectra $P_x(f)$ and $P_y(f)$ for each of the one or more frequencies $f$, wherein the determination of the gain function comprises:

for each of the plurality of said one or more frequencies $f$, determining $SNR(f)$ based on $P_x(f)$ and $P_y(f)$ and determining the gain function based on $\gamma_{ER}(f)$, wherein, for $f < f_T$, $\gamma_{ER}(f) = \min(1,\max(c1, SNR(f)/c2))$, wherein $f_T$, c1, and c2 comprise predetermined values.

17. The device of claim 16, wherein the controller module is configured to configure the adaptable filter such that the overall signal level of the filtered audio signal generally equals the overall signal level of the input audio signal.

18. The device of claim 17, wherein c=1.

19. The device of claim 16, wherein the controller module is configured to configure the adaptable filter such that a signal-to-noise ratio of a sound wave produced as a result of providing to the electro-acoustical transducer the signal corresponding to the filtered audio signal to background noise is maximized while restricting the maximum and minimum alteration of the filtered audio signal at different frequencies.

20. The device of claim 19, wherein said maximization of the signal-to-noise ratio is weighted differently for the different frequencies.

21. The device of claim 16, wherein the controller module is configured to determine the gain function for each of the one or more frequencies $f$ by determining $\phi_s(f)/\phi_n(f)$, where $\phi_s(f)$ comprises a function of $P_x(f)$ and $\phi_n(f)$ comprises a function of $P_y(f)$, wherein $SNR(f)=\phi_s(f)/\phi_n(f)$.

22. The device of claim 21, wherein the controller module is configured to determine the gain function by maximizing $(\Sigma\gamma(f)\cdot SNR(f)\cdot W(f))$, subject to the constraint that (i) $\Sigma\gamma(f)\cdot P_x(f)$ generally equals $\Sigma P_x(f)$ and (ii) the gain function is at least one of greater than or equal to a first value and less than or equal to a second value, wherein $SNR(f)=\phi_s(f)/\phi_n(f)$ and $W(f)$ comprises a predetermined weight for frequency $f$.

23. The device of claim 22, wherein the first value comprises a minimum threshold $\gamma_{min}(f)$ and the second value comprises a maximum threshold $\gamma_{max}(f)$.

24. The device of claim 23, wherein $\gamma_{min}(f)$ comprises a function of $SNR(f)$.

25. The device of claim 24, wherein $\gamma_{min}(f) = \min(1,\max(c1, SNR(f)/c2))$, wherein c1 and c2 comprise predetermined values.

26. The device of claim 21, wherein:

ϕ$_s$(f)=Λ$_{rx}$(f)·P$_s$(f), where P$_s$(f) comprises a function of P$_x$(f) and Λ$_{rx}$(f) comprises a function of the electro-acoustical transducer; and ϕ$_n$(f)=Λ$_{tx}$(f)·P$_n$(f), where P$_n$(f) comprises a function of P$_y$(f) and Λ$_{tx}$(f) comprises a function of the acoustic-electronic transducer.

27. The device of claim 16, wherein the controller module is configured to determine γ$_{ER}$(f$_T$) according to:

$$\gamma_{ER}(f_T) = \frac{\left(\sum_{f \geq f_T} P_S(t, \omega)\right) + \left(\sum_{f < f_T} (1 - \gamma_{ER}(f)) \cdot P_S(f)\right)}{\sum_{f \geq f_T} P_S(f)}.$$

28. The device of claim 27, wherein the controller module is configured to determine the gain function according to:

$$\gamma(f) = \gamma_{ER}(f) \frac{\sum_f P_x(f)}{\sum_f \gamma_{ER}(f) \cdot P_x(f)}.$$

29. The device of claim 27, wherein:

ϕ$_s$(f)=Λ$_{rx}$(f)·P$_s$(f), where P$_s$(f) comprises a function of P$_x$(f) and Λ$_{rx}$(f) comprises a function of the electro-acoustical transducer; and ϕ$_n$(f)=Λ$_{tx}$(f)·P$_n$(f), where P$_n$(f) comprises a function of P$_y$(f) and Λ$_{tx}$(f) comprises a function of the acoustic-electronic transducer.

30. The device of claim 16, wherein the adaptable filter is configured to filter the input audio signal in the frequency domain.

31. The device of claim 16, wherein the adaptable filter comprises a finite impulse response filter configured to filter the input audio signal in the time domain.

* * * * *